US00RE41632E

(19) United States
(12) Reissued Patent
Hwang et al.

(10) Patent Number: US RE41,632 E
(45) Date of Reissued Patent: Sep. 7, 2010

(54) LIQUID CRYSTAL DISPLAY DEVICE AND METHOD OF MANUFACTURING THE SAME

(75) Inventors: Kwangjo Hwang, Kyonggi-do (KR); Changwook Han, Seoul (KR)

(73) Assignee: LG Display Co., Ltd., Seoul (KR)

(21) Appl. No.: 11/984,431
(22) Filed: Nov. 16, 2007

Related U.S. Patent Documents

Reissue of:
(64) Patent No.: 6,337,284
Issued: Jan. 8, 2002
Appl. No.: 09/580,590
Filed: May 30, 2000

U.S. Applications:
(62) Division of application No. 10/752,486, filed on Jan. 7, 2004, now Pat. No. Re. 40,028.

(30) Foreign Application Priority Data

May 27, 1999 (KR) ..... 99-19145

(51) Int. Cl.
*G02F 1/136* (2006.01)
*H01L 21/302* (2006.01)
*H01L 31/00* (2006.01)

(52) U.S. Cl. ..... 349/43; 430/30; 257/59; 257/247; 438/158; 438/710; 438/718; 438/719; 438/725

(58) Field of Classification Search ..... 349/43; 259/59, 247; 438/30, 158, 710, 718–720, 438/725
See application file for complete search history.

(56) References Cited

U.S. PATENT DOCUMENTS 4,231,811 A 11/1980 Somekh et al.
5,032,531 A * 7/1991 Tsutsui et al. ..... 438/30

(Continued)

FOREIGN PATENT DOCUMENTS

JP 7-28074 1/1995
KR 97-59801 1/1996
KR 97-8662 2/1997

OTHER PUBLICATIONS

C.W. Kim et al., "A Novel Four–Mask–Count Process Architecture for TFT–LCDs," Society for Information Display International Symposium Digest of Technical Papers, vol. XXXI, Long Beach Convention Center, Long Beach, California, May 16–18, 2000, pp. 1006–1009.

(Continued)

*Primary Examiner*—Julie-Huyen L Ngo
(74) *Attorney, Agent, or Firm*—McKenna Long & Aldridge LLP

(57) ABSTRACT

The present invention discloses a method of manufacturing a liquid crystal display device including a first photolithography process forming a gate electrode on a substrate; a second photolithography process including: a) depositing sequentially a gate insulating layer, first and second semiconductor layers, and a metal layer; b) applying a first photoresist on the metal layer; c) aligning a first photo mask with the substrate; d) light exposing and developing the first photoresist to produce a first photoresist pattern; e) etching the metal layer using a first etchant, the first etchant ashing the first photoresist pattern on a predetermined portion of the metal layer to produce a second photoresist pattern, thereby exposing the predetermined portion of the metal layer; and f) etching the gate insulating layer, the first and second semiconductor layer, and the predetermined portion of the metal layer using a second etchant according to the second photoresist pattern to form source and drain electrodes, an ohmic contact layer, and an active area; a third photolithography process forming a passivation film and a contact hole; and a fourth photolithography process forming a pixel electrode connecting with the drain electrode through the contact hole.

2 Claims, 8 Drawing Sheets

U.S. PATENT DOCUMENTS

| | | | | | |
|---|---|---|---|---|---|
| 5,427,962 | A | * | 6/1995 | Sasaki et al. | 437/41 |
| 5,943,559 | A | * | 8/1999 | Maeda | 438/149 |
| 5,985,766 | A | | 11/1999 | Wu et al. | |
| 5,998,229 | A | * | 12/1999 | Lyu et al. | 438/30 |
| 6,043,511 | A | | 3/2000 | Ki | |
| 6,255,130 | B1 | | 7/2001 | Kim | |
| 6,255,668 | B1 | * | 7/2001 | Kang et al. | 257/59 |
| 6,287,899 | B1 | | 9/2001 | Park et al. | |
| 6,335,276 | B1 | | 1/2002 | Park et al. | |
| 6,410,211 | B1 | | 6/2002 | Bae | |
| 6,441,399 | B1 | | 8/2002 | Koyama et al. | |
| 6,774,969 | B2 | | 8/2004 | Ma et al. | |
| 2005/0145844 | A1 | * | 7/2005 | Jeong et al. | 257/59 |
| 2009/0184319 | A1 | * | 7/2009 | Kim et al. | 257/59 |

OTHER PUBLICATIONS

Chang Wook Han et al., "A TFT Manufactured by 4 Masks Process with New Photolithography, " SID KPS, Proceedings of the 18$^{th}$ International Display Research Conference, Asia Display '98, Sep. 28–Oct. 1, 1988, Seoul, Korea.

* cited by examiner

LIQUID CRYSTAL DISPLAY DEVICE AND METHOD OF MANUFACTURING THE SAME

Matter enclosed in heavy brackets [ ] appears in the original patent but forms no part of this reissue specification; matter printed in italics indicates the additions made by reissue.

*More than one reissue application has been filed for the reissue of U.S. Pat. No. 6,337,284. The reissue applications are application Ser. No. 11/984,431 which is a Divisional Reissue Application of Reissue U.S. patent application Ser. No. 10/752,486, filed on Jan. 7, 2004, now U.S. Pat. No. RE 40,028, which is a Reissue of U.S. patent application Ser. No. 09/580,590 now U.S. Pat. No. 6,337,284, which claims priority to Korean Patent Application No. 99-19145, all of which are hereby incorporated by reference as if fully set forth herein.*

CROSS REFERENCE

This application claims the benefit of Korean Patent Application No. 1999-19145, filed on May 27, 1999, under 35U.S.C. §119, the entirety of which is hereby incorporated by reference.

BACKGROUND OF THE INVENTION

1. Field of the Invention

The present invention relates to a liquid crystal display device, and more particularly to a liquid crystal display device fabricated through four photolithography processes and a method of fabricating the same.

2. Description of the Related Art

As shown in FIG. 1, a typical liquid crystal display (LCD) device has a gate bus line 60 arranged in a transverse direction and a data bus line 70 arranged in a longitudinal direction, a thin film transistor (TFT) formed near a cross point of the gate bus line 60 and the data bus line 70. The TFT has a source electrode 70a, a drain electrode 70b, a gate electrode 60a, and a semiconductor layer 80. The drain electrode 70b is connected to a pixel electrode 40.

The LCD device described above is completed through five photolithography processes.

Hereinafter, a method of fabricating the conventional LCD device will be explained in detail. FIGS. 2A to 2E show a process of manufacturing the conventional LCD device, and FIGS. 3A and 3B show a photolithography process to form a gate insulating layer 50, the amorphous silicon (a-Si) layer 80a, and an n-type impurity doped silicon ($n^+$ a-Si) layer 80b. Further, FIGS. 4A–4C show a photolithography process to form source and drain electrode 70a and 70b.

First, a gate electrode 60a shown in FIG. 2A is formed on a transparent substrate 10 during a first photolithography process.

In the first photolithography process, a metal layer (not shown) of Mo or Cr is deposited on the transparent substrate 10 and then a photoresist is applied on the metal layer. Then, a first photo-mask (not shown) is located over the substrate 10, and light exposure and developing processes are performed to etch the metal layer so that the gate electrode 60a is formed. Finally, the photoresist remaining on the metal layer is removed, leaving the gate electrode 60a on transparent substrate 10 as shown in FIG. 2A.

Second, a gate insulating layer 50, the a-Si layer 80a, and a $n^+$ a-Si layer 80b shown in FIG. 2B are sequentially formed during a second photolithography process, detailed as shown in FIGS. 3A and 3B.

As shown in FIG. 3A, a photoresist 88 is applied on the $n^+$ a-Si layer 80b. After that, light exposure and developing processes are performed using a second photo-mask 100, thereby forming a photoresist pattern 88a as shown in FIG. 3B. The a-Si layer 80a and the $n^+$ a-Si layer 80b are simultaneously etched according to the photoresist pattern 88a so that the gate insulating layer 50, the a-Si layer 80a, and the $n^+$ a-Si layer 80b are formed. Finally, the photoresist remaining on the $n^+$ a-Si layer 80b is removed.

Third, the source electrode 70a and the drain electrode 70b shown in FIG. 2C are formed during a third photolithography process, detailed as shown in FIGS. 4A–4C.

As shown in FIG. 4A, a metal layer 170 such as Cr is deposited over the whole surface of the substrate 10 while covering a-Si layer 80a and $n^+$ a-Si layer 80b. After that, the positive type photoresist 88 is applied, and then light exposure and developing processes are performed using a third photo-mask 200, thereby forming a photoresist pattern 88a as shown in FIG. 4B. In accordance with the photoresist pattern 88a, a lower metal layer 170 is etched to form the source electrode 70a and the drain electrode 70b as shown in FIG. 4C. Continually, the $n^+$ a-Si layer 80b is etched using the metal layer (source and drain electrodes) as a mask. Finally, the photoresist pattern 88a remaining on the source electrode 70a and the drain electrode 70b is removed.

Fourth, the passivation layer 55 having the contact hole 30 shown in FIG. 2D is formed during a fourth photolithography process.

An inorganic material such as a nitride or oxide of silicon (SiNx or SiOx, respectively) or an organic material such as bis-benzocyclobutene (BCB) is deposited on the source electrode 70a and the drain electrode 70b. After that, the positive type photoresist (not shown) is applied, and then light exposure and developing processes are performed using a fourth photo-mask (not shown) to form a photoresist pattern. Then, the passivation layer 55 is formed through an etching process. After the etching process, the photoresist pattern remaining on the passivation layer 55 is removed.

Fifth, the pixel electrode 40 to be connected to the drain electrode 76b shown in FIG. 2E is formed during a fifth photolithography process.

A metal layer such as indium tin oxide (ITO) is deposited on the passivation layer 55. After that, the positive type photoresist (not shown) is applied, and then light exposure and developing processes are performed using a fifth photomask (not shown), thereby forming a photoresist pattern. In accordance with the photoresist pattern, the metal layer is etched so that the pixel electrode 40 is formed. After the etching process, the photoresist pattern remaining on the pixel electrode 40 is removed.

The photolithography process described above includes the steps of: cleaning a substrate; applying a photoresist; soft-baking the photoresist; aligning a photo-mask; light-exposing the photoresist; developing the photoresist; inspecting the array substrate; hard-baking the photoresist; etching a portion that the photoresist does not cover; inspecting the array substrate; and removing the photoresist.

Since the photolithography process includes the complex steps described above, as the number of photolithography processes increases, the inferiority rate become greater, leading to a low yield. In other words, reliability of the manufacturing process varies inversely proportional to the number of photolithography processes performed.

SUMMARY OF THE INVENTION

An object of the present invention is to provide a liquid crystal display device fabricated through four photolithography processes.

Another object of the present invention is to increase yield and to reduce the production cost of TFT fabrication.

To achieve the above objects, the present invention provides a method of manufacturing a liquid crystal display device including a first photolithography process forming a gate electrode on a substrate; a second photolithography process including: a) depositing sequentially a gate insulating layer, first and second semiconductor layers, and a metal layer; b) applying a first photoresist on the metal layer; c) aligning a first photo mask with the substrate; d) light exposing and developing the first photoresist to produce a first photoresist pattern; e) etching the metal layer using a first etchant, the first etchant ashing the first photoresist pattern on a predetermined portion of the metal layer to produce a second photoresist pattern, thereby exposing the predetermined portion of the metal layer; and f) etching the gate insulating layer, the first and second semiconductor layer, and the predetermined portion of the metal layer using a second etchant according to the second photoresist pattern to form source and drain electrodes, an ohmic contact layer, and an active area; a third photolithography process forming a passivation film and a contact hole; and a fourth photolithography process forming a pixel electrode contacting with the drain electrode through the contact hole.

The first etchant contains $Cl_2/O_2$ gas and the second etchant contains $SF_6/HCl$ or $SF_6/H_2/Cl_2$ gas. The source and drain electrodes are made of a metal selected from a group consisting of Cr, Mo, Al, and Al alloy, and the first semiconductor layer comprises an amorphous silicon and the second semiconductor layer comprises an amorphous silicon doped with n-type impurity.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF THE INVENTION

Reference will now be made in detail to the preferred embodiment of the present invention, example of which is illustrated in the accompanying drawings.

Figure 1:
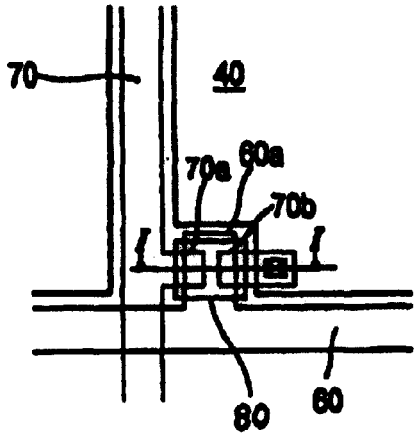
(RELATED ART) FIG.1
FIG. 1 is a plan view of a conventional liquid crystal display device.
Figure 2A:
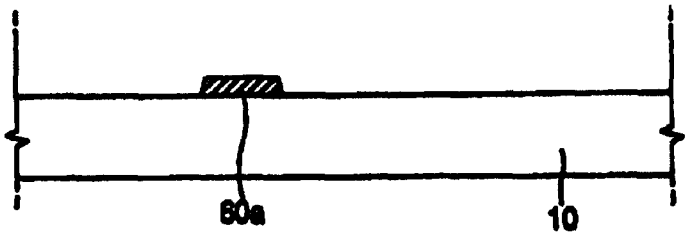
(RELATED ART) FIG.2A
FIGS. 2A to 2E are cross sectional views taken along line I—I of FIG. 1 showing a process of fabricating the conventional liquid crystal display device.
Figure 2B:
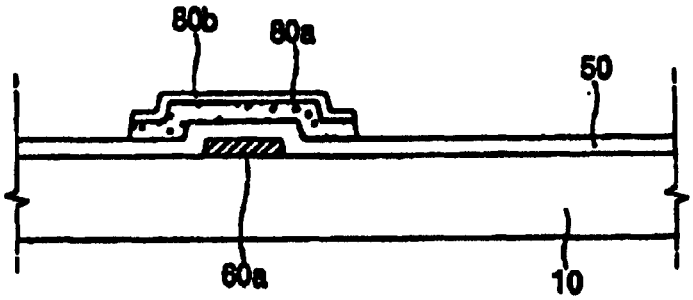
(RELATED ART) FIG.2B
Figure 2C:
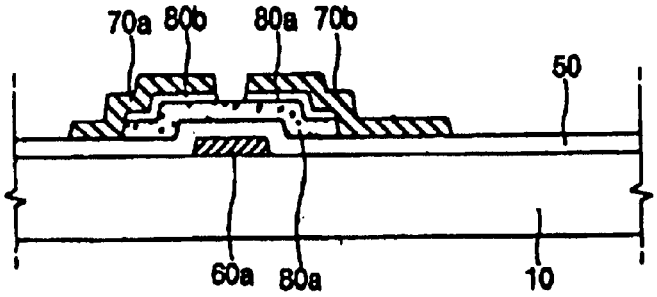
(RELATED ART) FIG.2C
Figure 2D:
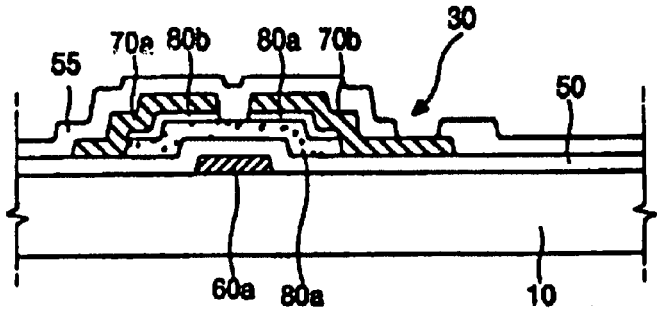
(RELATED ART) FIG.2D
Figure 2E:
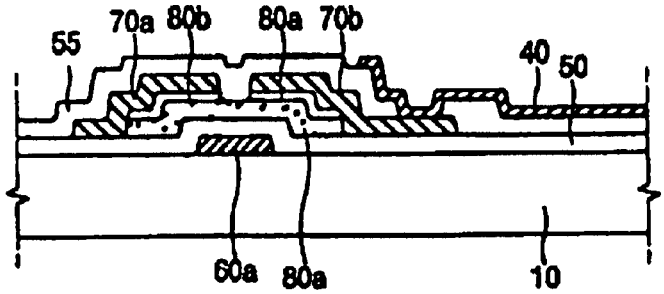
(RELATED ART) FIG.2E
Figure 3A:
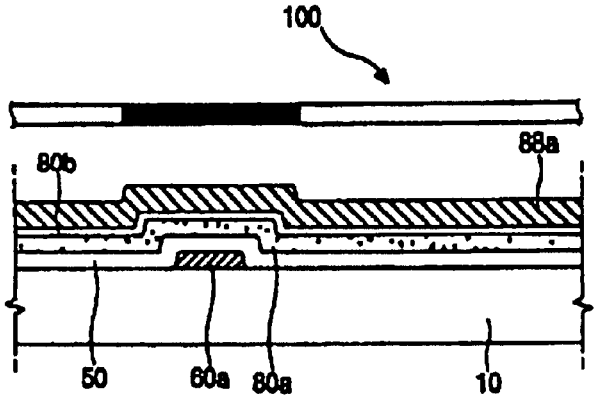
(RELATED ART) FIG.3A
FIGS. 3A and 3B are cross-sectional views illustrating a photolithography process corresponding to FIG. 2B.
Figure 3B:
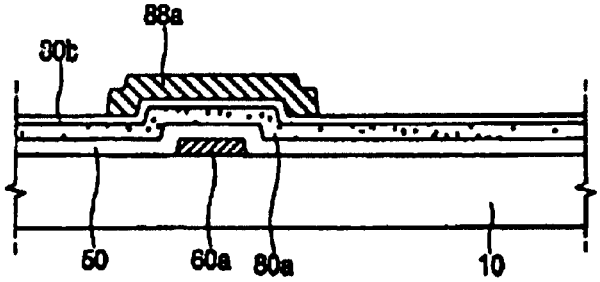
(RELATED ART) FIG.3B
Figure 4A:
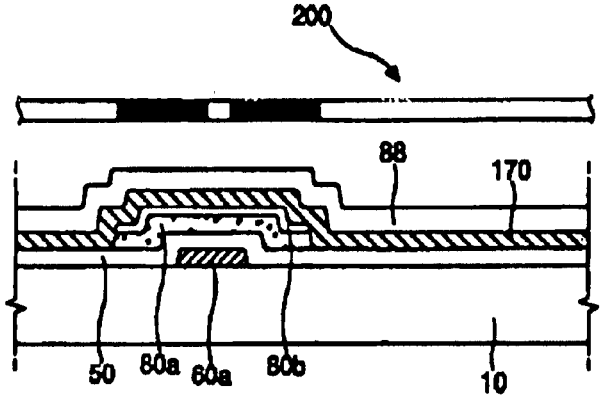
(RELATED ART) FIG.4A
FIGS. 4A to 4C are cross-sectional views illustrating a photolithography process corresponding to FIG. 2C.
Figure 4B:
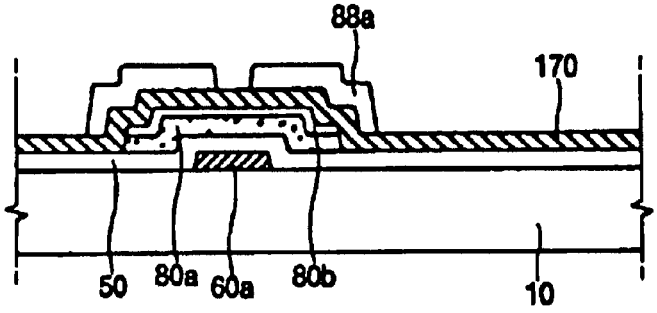
(RELATED ART) FIG.4B
Figure 4C:
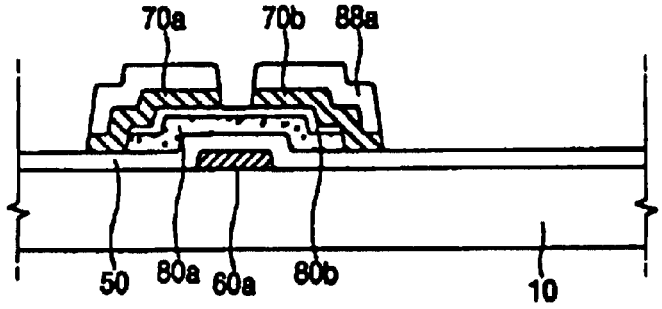
(RELATED ART) FIG.4C
Figure 5A:
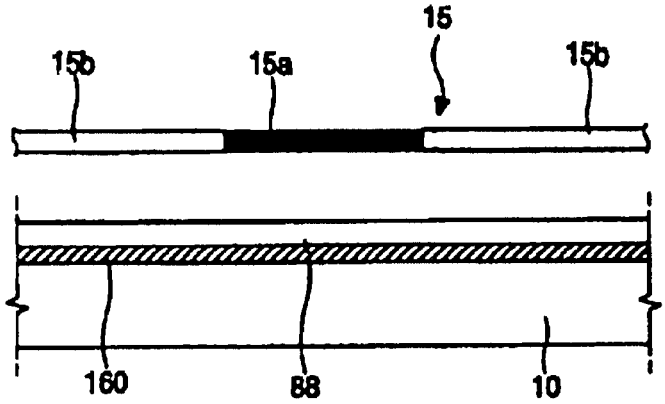
FIGS. 5A and 5B, 6A to 6E, 7A and 7B, and 8A to 8C are cross sectional views showing a process of fabricating a liquid crystal display device according to a preferred embodiment of the present invention.

As shown in FIG. 5A, in a first photolithography process, first, a metal layer 160 of Mo or Cr is deposited on a transparent substrate 10. After that, a positive type photoresist (photosensitive layer) 88 is applied on the metal layer 160, and then a first photo-mask 15 is aligned. In the first photo-mask, a region 15a represents a light shielding area and a region 15b represents a light transmitting area.

Figure 5B:
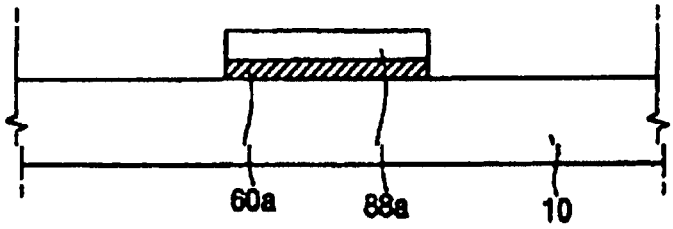

Referring to FIG. 5B, a gate electrode 60a is formed by etching the metal layer 160 according to a photoresist pattern 88a produced after light exposure and development of the photoresist 88. After that, the photoresist 88a remaining on the gate electrode 60a is removed.

Figure 6A:
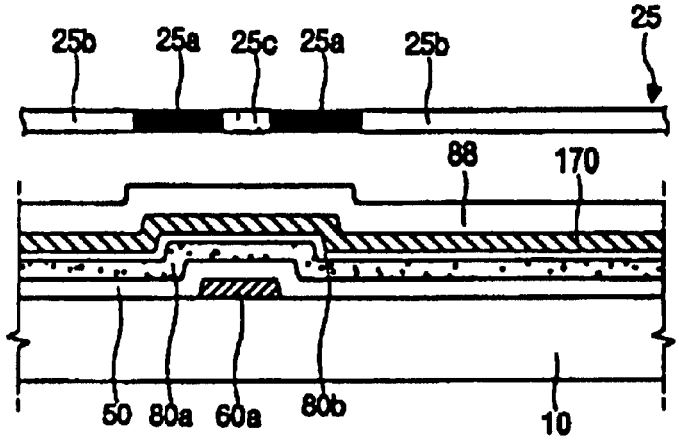

In a second photolithography process, as shown in FIG. 6A, a gate insulating layer 50 comprising an inorganic material such as SiNx and SiOx, an a-Si layer 80a, an $n^+$ a-Si layer 80b, and a single or multi-layered metal layer 170 made of a metal such as Cr, Mo, Al, and Al alloy are sequentially formed on the gate electrode 60a. After that, a positive type photoresist 88 is applied on the metal layer 170 and then a second photo-mask 25 partially executing a diffraction light exposure is aligned. At this time, a region 25a represents a light shielding area, a region 25b represents a light transmitting area, and a region 25c represents a diffraction light exposing area.

Figure 6B:
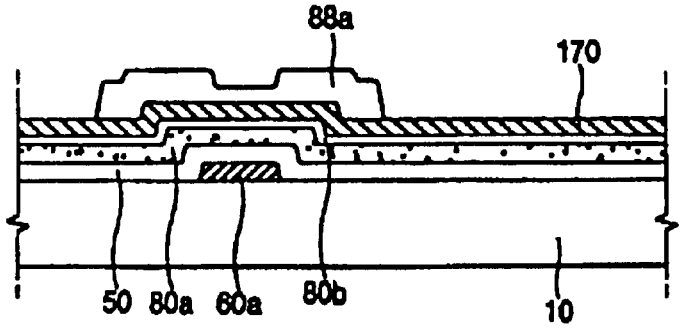

Further, as shown in FIG. 6B, a photoresist pattern 88a is formed by the second photo-mask 25. The region 25a is relatively thick and the region 25c is relatively thin in thickness. Further, the region 25b is completely removed so that a surface of the metal layer 170 is exposed. Specifically, the thickness of the photoresist pattern depends on a pattern shape of the second photo-mask 25.

Figure 6C:
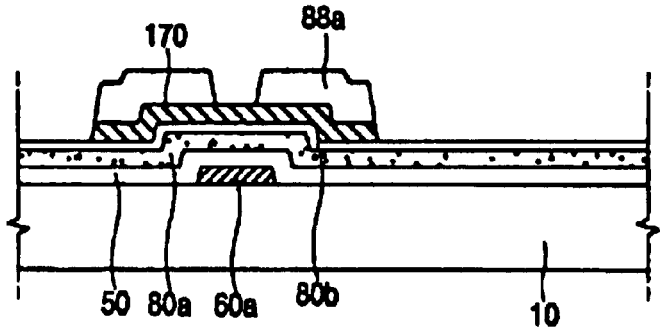

Continually, as shown in FIG. 6C, the metal layer 170 is etched by subjecting the array substrate 10 having the photoresist pattern 88a to a first etchant containing $Cl_2/O_2$ gas. When an etching process for the metal layer is completed, a central portion of the photoresist pattern 88a is removed by $O_2$ gas ashing, thereby exposing a central portion of the metal layer 170 corresponding to the central portion of the photoresist pattern 88a.

Figure 6D:
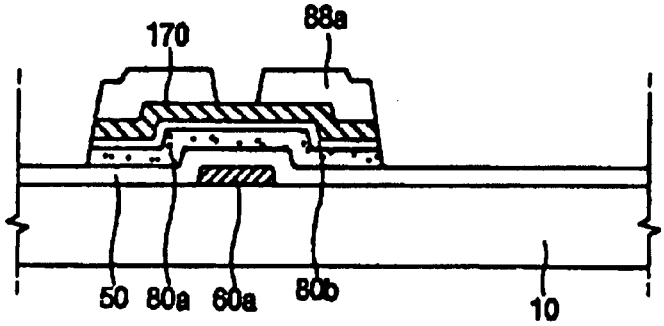
Figure 6E:
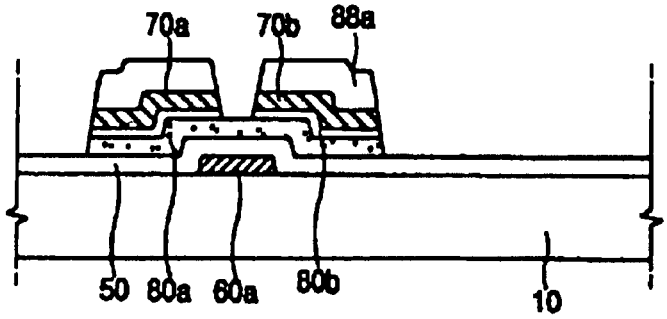

And then, as shown in FIG. 6D, the a-Si layer 80a and the $n^+$ a-Si layer 80b are etched by a second etchant preferably containing either $SF_6/HCl$ or $SF_6/H_2/Cl_2$ gas. At this time, the metal layer 170 functions as a mask.

Further, the exposed portion of the metal layer 170 and the central portion of the $n^+$ a-Si layer 80b corresponding to the exposed portion of the metal layer 170 are etched by a third etchant preferably containing $Cl_2/O_2$ gas, thereby forming an ohmic contact layer, and source and drain electrodes 70a and 70b. At this time, the photoresist pattern 88a functions as a mask.

Figure 9:
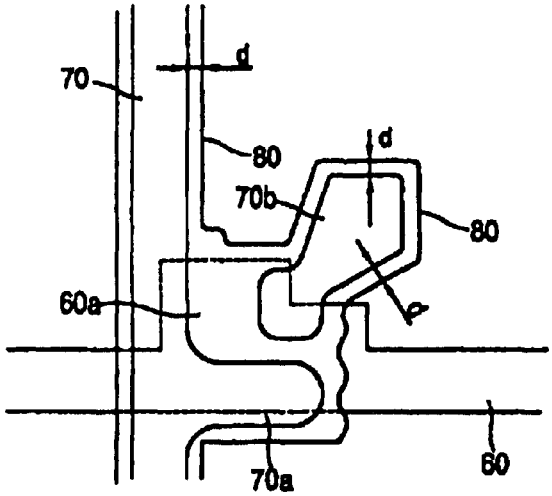
FIG. 9 is a plan view illustrating the liquid crystal display device according to the preferred embodiment of the present invention.

Subsequently, as shown in FIG. 9, by the diffraction light exposure as the inventive second photolithography process, the line edge of the source and drain electrodes 70a and 70b and the line edge of the semiconductor layer 80 are formed in the shape of curved lines. The dimension "d" represents a distance between the data bus line 70 and the semiconductor layer 80 or the drain electrode 70b and the semiconductor layer 80. Since the distance 'd' is maintained equally throughout, it is possible to prevent the distance difference due to misalignment during the photolithography process.

Figure 7A:
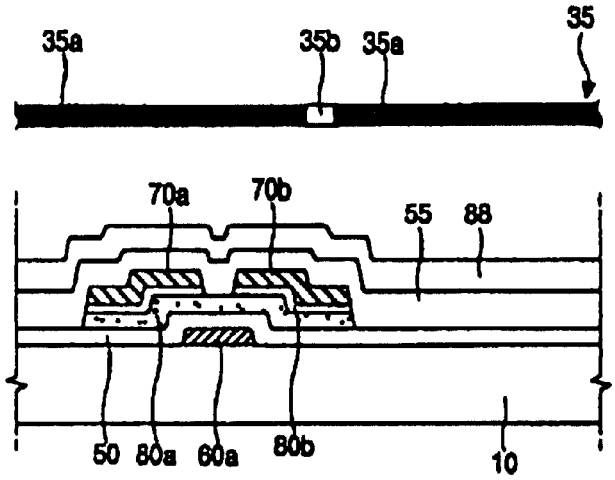
Figure 7B:
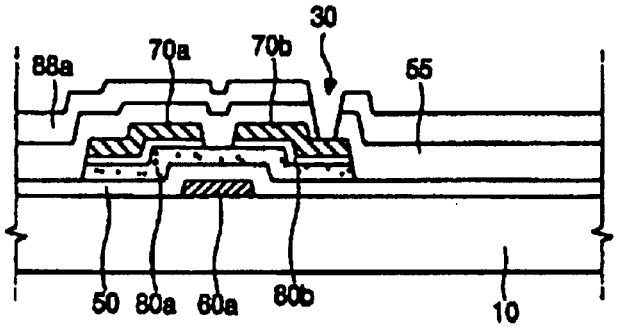

In a third photolithography process, as shown in FIG. 7A, an inorganic material such as SiNx and SiOx or an organic material such as BCB is deposited on the source and drain electrodes 70a and 70b to form a passivation layer 55. After that, the positive type photoresist 88 is applied on the passivation layer 55, and then light exposure and developing processes are executed using a third photo-mask 35, thereby forming a photoresist pattern 88a. In the third photo-mask 35, a region 35a represents a light shielding area and a region 35b represents a light transmitting area. Further, in accordance with the photoresist pattern 88a; as shown in FIG. 7B, the passivation layer 55 is etched to form a contact hole 30 and then the photoresist pattern remaining on the passivation 55 is removed.

Figure 8A:
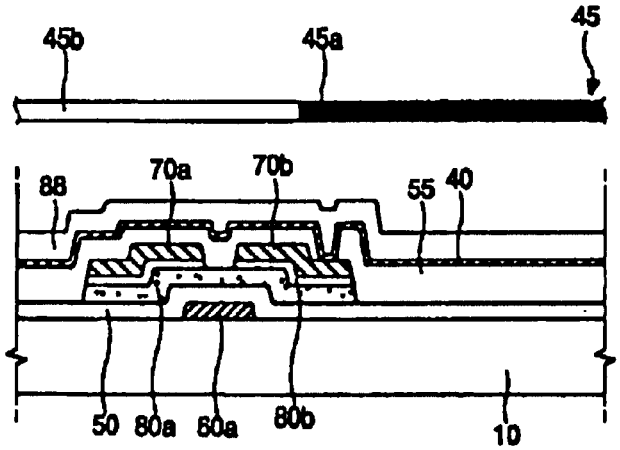
Figure 8B:
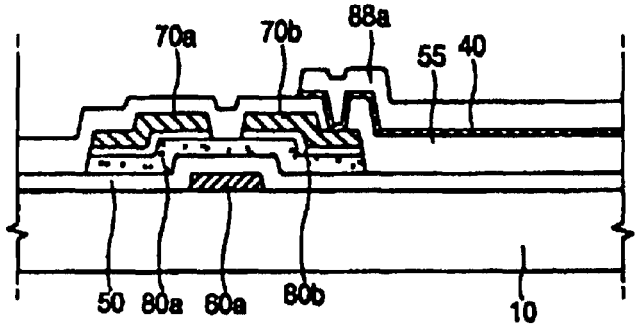
Figure 8C:
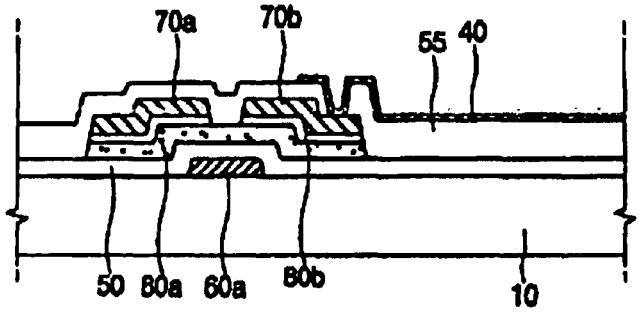

In a fourth photolithography process, as shown in FIG. 8A, a metal layer 140 made of ITO is deposited on the passivation layer 55 having the contact hole 30. After that, the positive type photoresist 88 is applied on the metal layer 140, and then the light exposure and developing processes are executed using a fourth photo-mask 45, thereby forming a photoresist pattern 88a. In the fourth photo-mask 45, a region 45a represents a light shielding area and a region 45b represents a light transmitting area. Further, in accordance with the photoresist pattern 88a, as shown in FIG. 8B, the metal layer 140 is etched so that the pixel electrode 40 is formed. After etching process, the photoresist pattern 88a remaining on the pixel electrode 40 is removed as shown in FIG. 8C.

Accordingly, the substantially important components of liquid crystal display device according to the preferred embodiment of the present invention are completed by four photolithography processes described above.

In the present invention, since the a-Si layer 80a, the $n^+$ a-Si layer 80b and the source and drain electrodes are simultaneously formed through the same photolithography process, that is, by the diffraction light exposure using the second photo-mask, it is possible to manufacture the LCD device through the four lithography processes, thereby increasing the yield and reducing the production cost by decreasing the inferiority rate due to many photolithography processes.

It is further understood by those skilled in the art that the foregoing description is a preferred embodiment of the disclosed device and that various changes and modification may be made in the invention without departing from the spirit and scope thereof.

What is claimed is:

[1. A method of manufacturing a liquid crystal display device, comprising:

a first photolithography process forming a gate electrode on a substrate;

a second photolithography process including:

a) depositing sequentially a gate insulating layer, a semiconductor layer, and a metal layer;

b) applying a first photoresist on the metal layer;

c) aligning a first photo mask with the substrate;

d) light exposing and developing the first photoresist to produce a first photoresist pattern;

e) etching the metal layer using a first etchant, the first etchant ashing the first photoresist pattern on a portion of the metal layer to produce a second photoresist pattern, thereby exposing the portion of the metal layer; and f) etching the gate insulating layer, the semiconductor layer, and the portion of the metal layer using a second etchant according to the second photoresist pattern to form source and drain electrodes, an ohmic contact layer, and an active area;

a third photolithography process forming a passivation film and a contact hole; and a fourth photolithography process forming a pixel electrode connecting with the drain electrode through the contact hole.]

[2. The method of claim 1, wherein the first etchant includes $Cl_2/O_2$ gas.]

[3. The method of claim 2, wherein the second etchant includes $SF_6$/HCl gas.]

[4. The method of claim 2, wherein the second etchant includes $SF_6/H_2/Cl_2$ gas.]

[5. The method of claim 1, wherein the semiconductor layer includes first and second semiconductor layers.]

[6. The method of claim 5, wherein the first semiconductor layer includes amorphous silicon.]

[7. The method of claim 5, wherein the second semiconductor layer includes doped amorphous silicon.]

[8. The method of claim 1, wherein the source and drain electrodes are made of a metal selected from a group consisting of Cr, Mo, Al, and Al alloy.]

[9. The method of claim 8, wherein the semiconductor layer includes first and second semiconductor layers.]

[10. The method of claim 9, wherein the first semiconductor layer includes amorphous silicon.]

[11. The method of claim 9, wherein the second semiconductor layer includes doped amorphous silicon.]

[12. The method of claim 1, wherein the pixel electrode includes indium tin oxide.]

[13. The method of claim 12, wherein the semiconductor layer includes first and second semiconductor layers.]

[14. The method of claim 13, first semiconductor layer includes amorphous silicon.]

[15. The method of claim 13, wherein the second semiconductor layer includes doped amorphous silicon.]

*16. A liquid crystal display device comprising:*

*a thin film transistor made from;*

*forming a gate electrode on a substrate;*

*forming a gate insulating layer, a semiconductor layer, and a metal layer over the gate electrode;*

*forming a photoresist over the metal layer, the photoresist including a central portion having a first thickness and a side portion having a second thickness, the first thickness being smaller than the second thickness; and*

*selectively removing the metal layer and the semiconductor layer including portions of the metal layer below the central portion of the photoresist to form source and drain electrodes and a channel;*

*a data line and a gate line defining a pixel region, the data line have a first width, the width of the data line being smaller than a width of the semiconductor layer.*

*17. The liquid crystal display device according to claim 16, wherein the data line and the semiconductor layer extend substantially in parallel from a top of the pixel region to a bottom of the pixel region.*

* * * * *